(12) United States Patent
Lee

(10) Patent No.: US 12,087,702 B2
(45) Date of Patent: Sep. 10, 2024

(54) MEMORY DEVICE AND SEMICONDUCTOR DEVICE COMPRISING ELECTROSTATIC DISCHARGE PROTECTION ELEMENT

(71) Applicant: NANYA TECHNOLOGY CORPORATION, New Taipei (TW)

(72) Inventor: Chun-Lu Lee, Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 18/485,323

(22) Filed: Oct. 12, 2023

(65) Prior Publication Data

US 2024/0038681 A1 Feb. 1, 2024

Related U.S. Application Data

(62) Division of application No. 17/450,835, filed on Oct. 14, 2021, now Pat. No. 11,848,278.

(51) Int. Cl.
| | |
|---|---|
| *H01L 27/02* | (2006.01) |
| *H01L 23/00* | (2006.01) |
| *H01L 23/498* | (2006.01) |
| *H01L 23/552* | (2006.01) |
| *H01L 25/065* | (2023.01) |

(52) U.S. Cl.
CPC ...... *H01L 23/552* (2013.01); *H01L 23/49816* (2013.01); *H01L 24/14* (2013.01); *H01L 25/0657* (2013.01); *H01L 27/0248* (2013.01)

(58) Field of Classification Search
CPC . H01L 23/552; H01L 23/49816; H01L 24/14; H01L 25/0657; H01L 27/0248

USPC .................................................... 257/659
See application file for complete search history.

(56) References Cited

U.S. PATENT DOCUMENTS

| | | | |
|---|---|---|---|
| 2009/0283898 A1* | 11/2009 | Janzen | H01L 25/0657 257/E21.597 |
| 2012/0309128 A1* | 12/2012 | Janzen | H01L 23/62 257/E21.586 |
| 2013/0228867 A1* | 9/2013 | Suematsu | H01L 23/60 257/355 |
| 2014/0082345 A1* | 3/2014 | Asano | H01L 23/5228 257/777 |
| 2016/0247747 A1* | 8/2016 | Janzen | H01L 24/17 |
| 2019/0273052 A1* | 9/2019 | Davis | G11C 5/025 |

* cited by examiner

*Primary Examiner* — Didarul A Mazumder
(74) *Attorney, Agent, or Firm* — CKC & Partners Co., LLC

(57) ABSTRACT

The memory device includes a substrate, a first ball grid array, a first integrated circuit chip, and a first electrostatic discharge protection element. The first ball grid array is disposed on the substrate. The first integrated circuit chip is disposed on the first ball grid array. The first electrostatic discharge protection element is coupled between the second input/output pad of the first integrated circuit chip and the first internal circuit. The first electrostatic discharge protection element is configured to form a first electrostatic discharge path from the second input/output pad to a first voltage supply line. The first electrostatic discharge protection element includes multiple electrostatic discharge units, and at least one of the electrostatic discharge units is free of coupling between the second input/output pad, the first voltage supply line, and the first internal circuit.

11 Claims, 13 Drawing Sheets

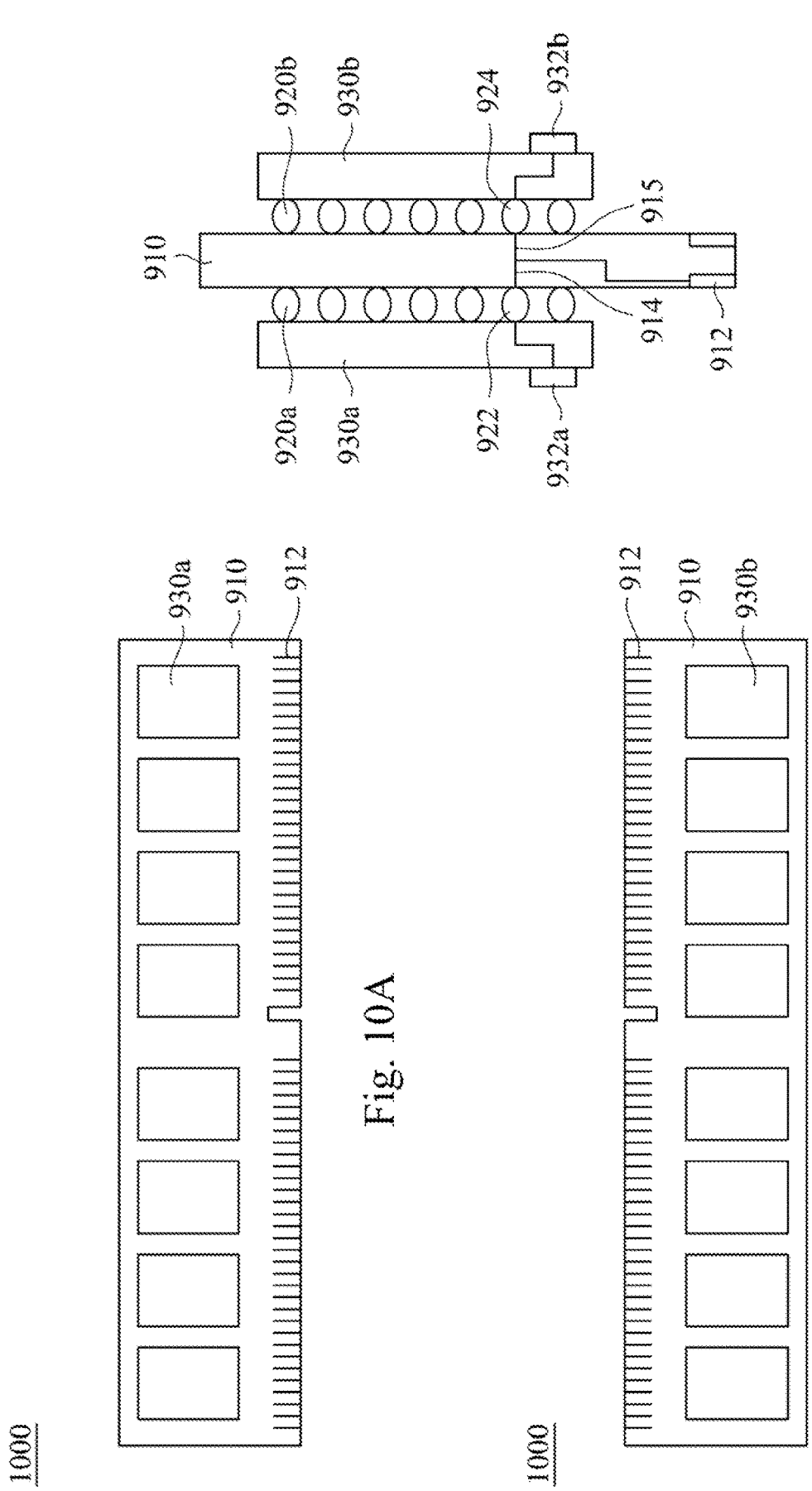

MEMORY DEVICE AND SEMICONDUCTOR DEVICE COMPRISING ELECTROSTATIC DISCHARGE PROTECTION ELEMENT

CROSS-REFERENCE TO RELATED APPLICATION

The present application is a Divisional Application of the U.S. application Ser. No. 17/450,835, filed Oct. 14, 2021, which is herein incorporated by reference in its entirety.

BACKGROUND

Field of Invention

The present disclosure relates to a package device, a memory device, and a semiconductor device.

Description of Related Art

With the development of semiconductor technology, the performance of electronic products has become increased. For example, the transmission speed of signals has increased, and the power consumption of electronic products has reduced. However, the signal strength would decrease under high-speed operation, and larger input/output pad capacitance would also reduce signal margins.

Therefore, there is a need to solve the above problems.

SUMMARY

One aspect of the present disclosure is to provide a memory device. The memory device includes a substrate, a first ball grid array, a first integrated circuit chip, and a first electrostatic discharge protection element. The substrate includes a first input/output pad disposed on the substrate. The first ball grid array is disposed on the substrate and includes a first input/output pin. The first integrated circuit chip is disposed on the first ball grid array. The first integrated circuit chip includes a first internal circuit and a second input/output pad. The second input/output pad is disposed on the first integrated circuit chip and is coupled to the first internal circuit. The first input/output pad and the second input/output pad couples to the first input/output pin. The first electrostatic discharge protection element is coupled between the second input/output pad and the first internal circuit. The first electrostatic discharge protection element is configured to form a first electrostatic discharge path from the second input/output pad to a first voltage supply line. The first electrostatic discharge protection element includes multiple electrostatic discharge units, and at least one of the electrostatic discharge units is free of coupling between the second input/output pad, the first voltage supply line, and the first internal circuit.

In some embodiments, the memory device further includes a second electrostatic discharge protection element coupled between the second input/output pad and the first internal circuit. The second electrostatic discharge protection element is configured to form a second electrostatic discharge path from the second input/output pad to a second voltage supply line. The second electrostatic discharge protection element includes multiple electrostatic discharge units, and at least one of the electrostatic discharge units is free of coupling between the second input/output pad, the second voltage supply line, and the first internal circuit.

In some embodiments, each of the electrostatic discharge units includes more than one electrostatic discharge protection circuits (not limited to a diode and a resistor) in series.

In some embodiments, the memory device further includes a second ball grid array and a second integrated circuit chip. The second ball grid array is disposed on the substrate and includes a second input/output pin. The second integrated circuit chip is disposed on the second ball grid array. The second integrated circuit chip includes a second internal circuit and a third input/output pad. The third input/output pad is disposed on the second integrated circuit chip and is coupled to the second internal circuit. The first input/output pad and the third input/output pad couples to the second input/output pin.

In some embodiments, the memory device further includes a third ball grid array, a third integrated circuit chip, a fourth ball grid array, and a fourth integrated circuit chip. The third ball grid array is disposed on the substrate includes a third input/output pin. The third integrated circuit chip is disposed on the third ball grid array. The third integrated circuit chip includes a third internal circuit and a fourth input/output pad. The fourth input/output pad is disposed on the third integrated circuit chip and is coupled to the third internal circuit. The first input/output pad and the fourth input/output pad couples to the third input/output pin. The fourth ball grid array is disposed on the substrate and includes a fourth input/output pin. The fourth integrated circuit chip is disposed on the fourth ball grid array. The fourth integrated circuit chip includes a fourth internal circuit and a fifth input/output pad. The fifth input/output pad is disposed on the fourth integrated circuit chip and is coupled to the fourth internal circuit. The first input/output pad and the fifth input/output pad couples to the fourth input/output pin.

One aspect of the present disclosure is to provide a semiconductor device. The semiconductor device includes a ball grid array, a substrate, a memory device, a processor, and a first electrostatic discharge protection element. The substrate is disposed on the ball grid array and includes an interconnect structure. The memory device is disposed on the substrate. The memory device includes an internal circuit and a first input/output pad disposed on the memory device. The processor is disposed on the substrate and adjacent to the memory device. The first electrostatic discharge protection element is coupled between the first input/output pad and the internal circuit. The first electrostatic discharge protection element is configured to form a first electrostatic discharge path from the first input/output pad to a first voltage supply line. The first electrostatic discharge protection element includes multiple electrostatic discharge units, and at least one of the electrostatic discharge units is free of coupling between the first input/output pad, the first voltage supply line, and the internal circuit. The first input/output pad of the memory device couples to a second input/output pad of the processor through the interconnect structure.

In some embodiments, the semiconductor device further includes a second electrostatic discharge protection element coupled between the first input/output pad and the internal circuit. The second electrostatic discharge protection element is configured to form a second electrostatic discharge path from the first input/output pad to a second voltage supply line. The second electrostatic discharge protection element includes multiple electrostatic discharge units, and at least one of the electrostatic discharge units is free of coupling between the first input/output pad, the second voltage supply line, and the internal circuit.

In some embodiments, the memory device is a dynamic random access memory.

In some embodiments, the memory device is a flash memory.

In some embodiments, the processor is a flash controller stacked on the memory device.

In some embodiments, the semiconductor device further includes a dynamic random access memory stacked between the memory device and the processor.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIG. 10A and FIG. 10B are top views of a 2-rank double in-line memory module (DIMM) device in accordance with some embodiments.

FIG. 10C is a cross-sectional view of the 2-rank double in-line memory module (DIMM) device in FIG. 10A and FIG. 10B.

DETAILED DESCRIPTION

Figure 1:
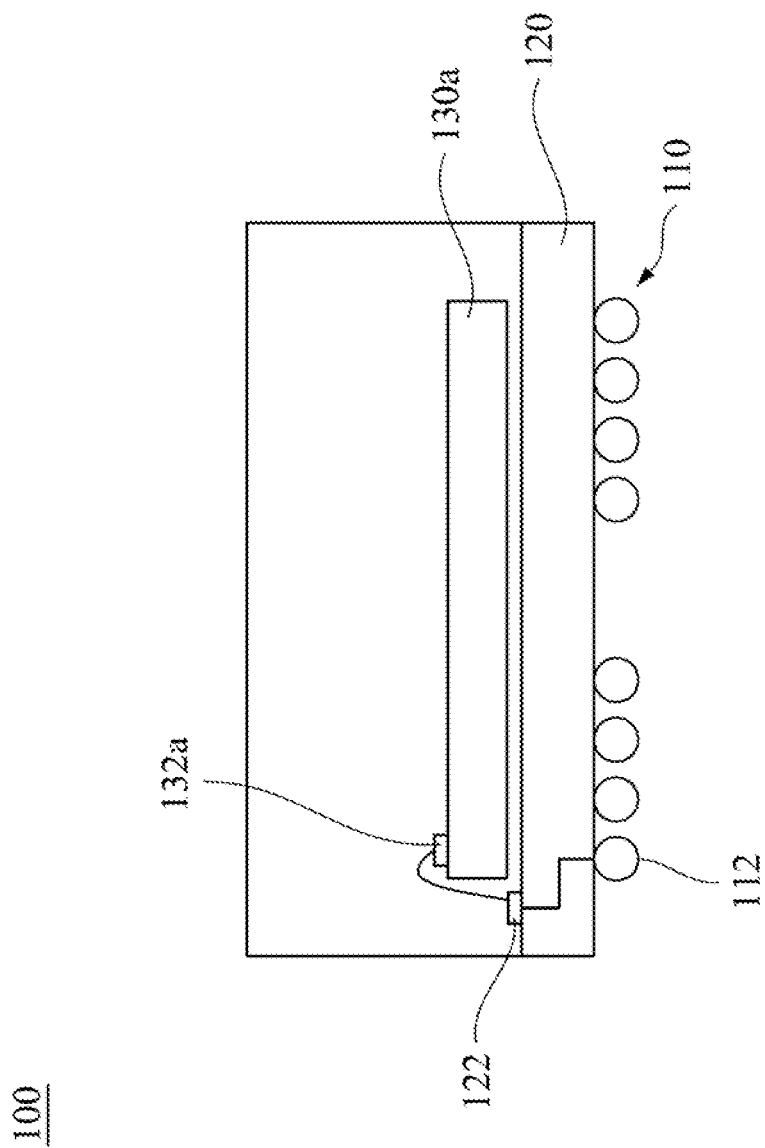
FIG. 1 is a cross-sectional view of a 1-rank single die package (SDP) device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed. It should be understood that the number of any elements/components is merely for illustration, and it does not intend to limit the present disclosure.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the embodiments. As used herein, the term "and/or" includes any and all combinations of one or more of the associated listed items.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Hereinafter, several embodiments of the present disclosure will be disclosed with the accompanying figures. Many practical details will be described in the following description for a clear description. However, it should be understood that these practical details should not be used to limit the present disclosure. That is, in some embodiments of the present disclosure, these practical details are unnecessary. In addition, in order to simplify the figures, some conventional structures and elements will be shown in the figures in a simple schematic manner.

In order to obtain correct data with enough signal margins, there are some approaches to solve the problem of reduced signal margins. It can be solved by improving characteristics of receivers and drivers. Another approach is reducing input capacitance to get better signals. Generally, one or more electrostatic discharge (ESD) protection elements would be formed near an input/output (I/O) pad to avoid electrostatic current flowing into internal circuits of an integrated circuit (IC) chip and causing damage. However, the ESD protection elements under ESD stress would generate heat due to electrostatic discharge, and the heat would affect the ESD protection elements. If the heat is greater than the limiting value of the ESD protection elements, the ESD protection elements would be damaged. Therefore, the design of the ESD protection elements are important to control the currents in the IC chip for getting better signal quality which has benefits for high-performance computing and decreasing operating voltage of the signals.

The present disclosure provides an ESD protection element of an IC chip to reduce input capacitance of the IC chip. The disclosed ESD protection element includes multiple ESD units, and at least one of the ESD units is free of coupling to the circuits in the IC chip. The ESD protection element of the present disclosure can be applied in a plural-rank device (such as 2-rank device, 3-rank device, or 4-rank device), a silicon in package (SiP) device, an embedded multi-chip package (eMCP) device, or a solid state disk (SSD) device. The disclosed ESD protection element can reduce the capacitance of the I/O pad of the IC chip, thereby achieving better signal quality.

With reference to FIG. 1, FIG. 1 is a cross-sectional view of a 1-rank single die package (SDP) device 100 in accordance with some embodiments. The SDP device 100 includes a ball grid array (BGA) 110, a substrate 120, and a first integrated circuit (IC) chip 130*a* (can also be referred to as "die 1"). The substrate 120 is disposed on the BGA 110, and the first IC chip 130*a* is disposed on the substrate 120. The substrate 120 may be a motherboard or a printed circuit board, and is configured to assemble one IC chip or multiple IC chips. An input/output (I/O) pad 122 of the substrate 120 is disposed on the substrate 120 and an input/output (I/O) pad 132*a* of the first IC chip 130*a* is disposed on the first IC chip 130*a*. The I/O pad 122 of the substrate 120 is coupled to an input/output (I/O) pin 112 of the BGA 110, as shown in FIG. 1. It is understood that the BGA 110 includes multiple balls and the I/O pin 112 herein represents a ball that couples to the I/O pad 122 of the substrate 120. The I/O pad 122 of the substrate 120 is coupled to the I/O pad 132*a* of the first IC chip 130*a*. The first IC chip 130*a* is disposed on the substrate 120 by connecting the I/O pad 132*a*, the I/O pad 122, and the I/O pin 112.

The first IC chip 130*a* in FIG. 1 further includes internal circuits 134 (see FIG. 5) adjacent to the I/O pad 132*a* and at least one ESD protection element (see FIG. 5, such as ESD protection elements 136*a*-136*e*) adjacent to the I/O pad 132*a*. The detailed description of the ESD protection elements 136*a*-136*e* will be discussed in FIG. 5 to FIG. 8 below. The I/O pad 132*a* of the first IC chip 130*a* is coupled to the internal circuits 134 of the first IC chip 130*a*.

It is noticed that the SDP device 100 in FIG. 1 illustrates one I/O pin (of the BGA) coupling to one I/O pad (of the IC chips). In other words, the I/O pin 112 of the BGA 110 couples to the I/O pad 132*a* of the first IC chip 130*a* through the I/O pad 122 of the substrate 120. Therefore, the SDP device 100 can be referred to as a 1-rank device or a single-rank device.

Figure 2B:
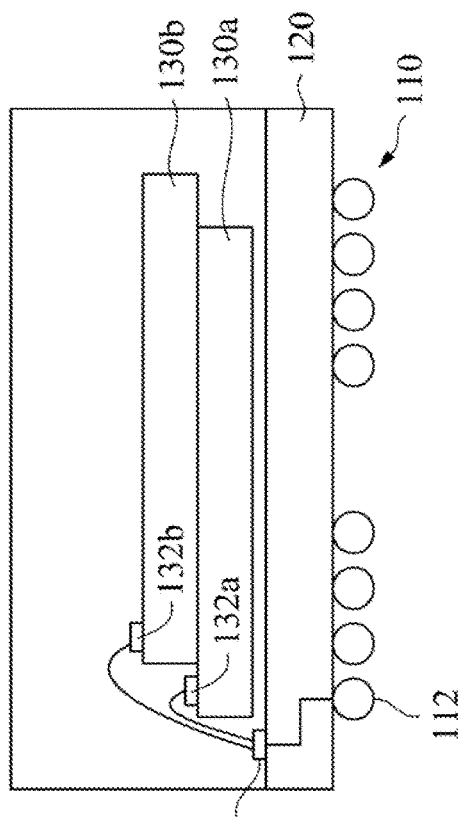
FIG. 2B is a cross-sectional view of a 2-rank double die package (DDP) device in accordance with some embodiments.
Figure 2A:
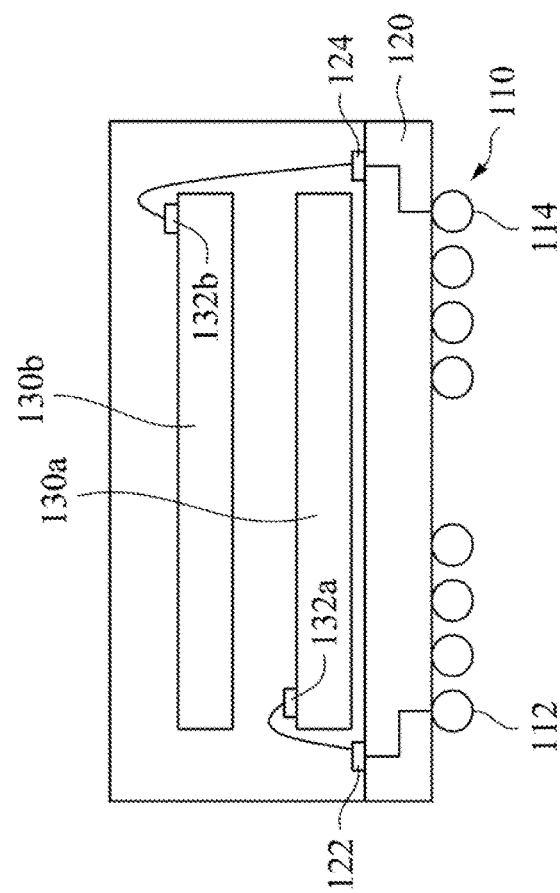
FIG. 2A is a cross-sectional view of a 1-rank double die package (DDP) device in accordance with some embodiments.

With reference to FIG. 2A, FIG. 2A is a cross-sectional view of a 1-rank double die package (DDP) device 200A in accordance with some embodiments. The difference between the SDP device 100 in FIG. 1 and the DDP device 200A in FIG. 2A is that the DDP device 200A further includes a second integrated circuit (IC) chip 130*b* (can also be referred to as "die 2"). The second IC chip 130*b* is stacked on the first IC chip 130*a*. The second IC chip 130*b* includes an input/output (I/O) pad 132*b* and internal circuits adjacent to the I/O pad 132*b*. The I/O pad 132*b* of the second IC chip 130*b* is disposed on the second IC chip 130*b* and is coupled to the internal circuits of the second IC chip 130*b*. An I/O pad 124 of the substrate 120 is coupled to an input/output (I/O) pin 114 of the BGA 110, as shown in FIG. 2A. It is understood that the BGA 110 includes multiple balls and the I/O pin 114 herein represents a ball that couples to the I/O pad 122 of the substrate 120.

Still refer to FIG. 2A. The I/O pad 122 of the substrate 120 is coupled to the I/O pad 132*a* of the first IC chip 130*a*, and the I/O pad 124 of the substrate 120 is coupled to the I/O pad 132*b* of the second IC chip 130*b*. The second IC chip 130*b* is disposed on the substrate 120 by connecting the I/O pad 132*b*, the I/O pad 124, and the I/O pin 114. In some embodiments, the second IC chip 130*b* further includes at least one ESD protection element adjacent to the I/O pad 132*b* of the second IC chip 130*b*.

It is noticed that the DDP device 200A in FIG. 2A illustrates one I/O pin (of the BGA) coupling to one I/O pad (of the IC chips). In other words, the I/O pin 112 of the BGA 110 couples to the I/O pad 132*a* of the first IC chip 130*a* through the I/O pad 122 of the substrate 120, and the I/O pin 114 of the BGA 110 couples to the I/O pad 132*b* of the second IC chip 130*b* through the I/O pad 124 of the substrate 120. Therefore, the DDP device 200A can be referred to as a 1-rank device or a single-rank device.

With reference to FIG. 2B, FIG. 2B is a cross-sectional view of a 2-rank double die package (DDP) device 200B in accordance with some embodiments. The difference between the DDP device 200A in FIG. 2A and the DDP device 200B in FIG. 2B is the connections of the first IC chip 130*a* and the second IC chip 130*b*.

It is noticed that the DDP device 200B in FIG. 2B illustrates one I/O pin (of the BGA) coupling to two I/O pad (of the IC chips). The second IC chip 130*b* is disposed on the substrate 120 by connecting the I/O pad 132*b*, the I/O pad 122, and the I/O pin 112. In other words, the I/O pin 112 of the BGA 110 simultaneously couple to the I/O pad 132*a* of the first IC chip 130*a* and the I/O pad 132*b* of the second IC chip 130*b* through the I/O pad 122 of the substrate 120. Therefore, the DDP device 200B can be referred to as a 2-rank device or a plural-rank device.

Figure 3:
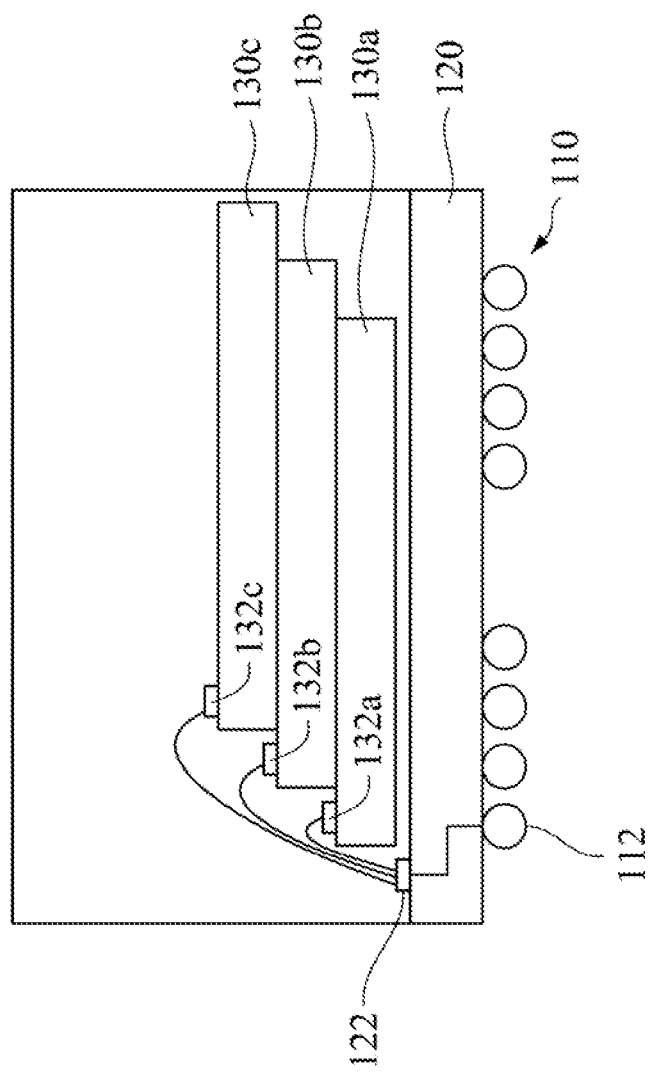
FIG. 3 is a cross-sectional view of a 3-rank triple die package (TDP) device in accordance with some embodiments.

With reference to FIG. 3, FIG. 3 is a cross-sectional view of a 3-rank triple die package (TDP) device 300 in accordance with some embodiments. The difference between the DDP device 200B in FIG. 2B and the TDP device 300 in FIG. 3 is that the TDP device 300 further includes a third integrated circuit (IC) chip 130*c* (can also be referred to as "die 3"). The third IC chip 130*c* is stacked on the second IC chip 130*b*. The third IC chip 130*c* includes an input/output (I/O) pad 132*c* and internal circuits adjacent to the I/O pad 132*c*. The I/O pad 132*c* is disposed on the third IC chip 130*c* and is coupled to the internal circuits of the third IC chip 130*c*. The third IC chip 130*c* is disposed on the substrate 120 by connecting the I/O pad 132*c*, the I/O pad 122, and the I/O pin 112. In some embodiments, the third IC chip 130*c* further includes at least one ESD protection element adjacent to the I/O pad 132*c* of the third IC chip 130*c*.

It is noticed that the TDP device 300 in FIG. 3 illustrates one I/O pin (of the BGA) coupling to three I/O pads (of the IC chips). In other words, the I/O pin 112 of the BGA 110 simultaneously couple to the I/O pad 132*a* of the first IC chip 130*a*, the I/O pad 132*b* of the second IC chip 130*b*, and the I/O pad 132*c* of the third IC chip 130*c* through the I/O pad 122 of the substrate 120. Therefore, the TDP device 300 can be referred to as a 3-rank device or a plural-rank device.

Figure 4:
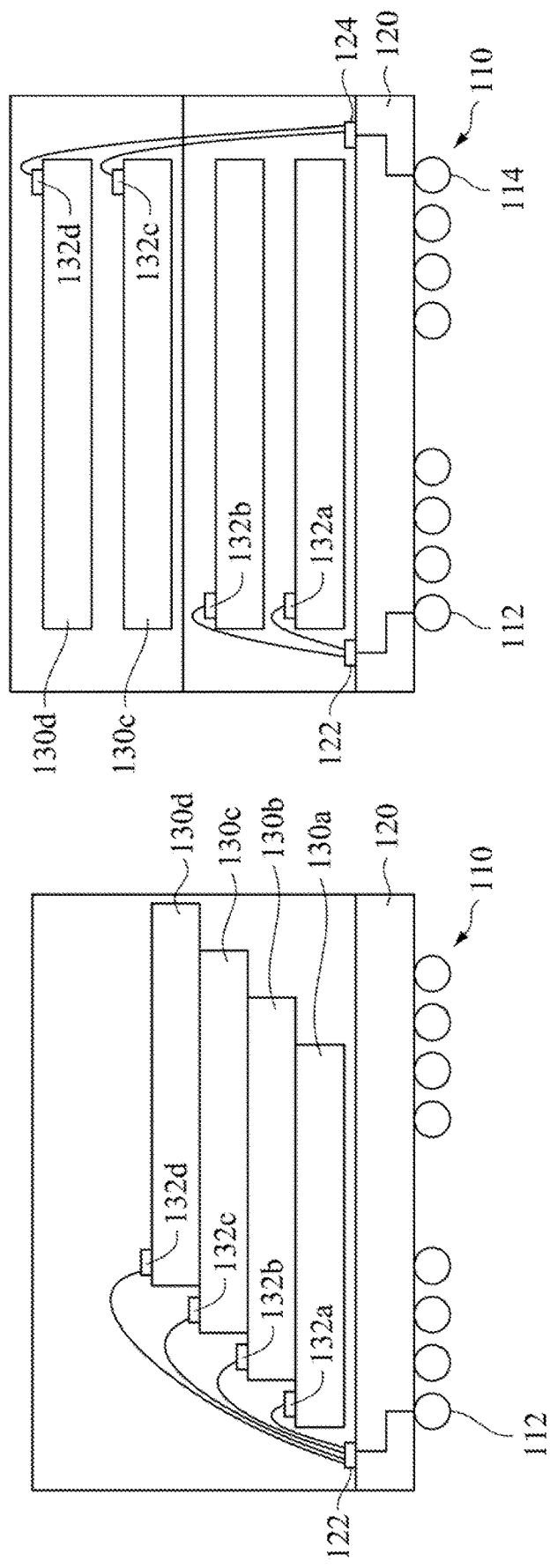
FIG. 4A is a cross-sectional view of a 4-rank quad die package (QDP) device in accordance with some embodiments.
FIG. 4B is a cross-sectional view of a 2-rank quad die package (QDP) device in accordance with some embodiments.

With reference to FIG. 4A, FIG. 4A is a cross-sectional view of a 4-rank quad die package (QDP) device 400A in accordance with some embodiments. The difference between the TDP device 300 in FIG. 3 and the QDP device 400A in FIG. 4A is that the QDP device 400A further includes a fourth integrated circuit (IC) chip 130d (can also be referred to as "die 4"). The fourth IC chip 130d is stacked on the third IC chip 130c. The fourth IC chip 130d includes an input/output (I/O) pad 132d and internal circuits adjacent to the I/O pad 132d. The I/O pad 132d is disposed on the fourth IC chip 130d and is coupled to the internal circuits of the fourth IC chip 130d. The fourth IC chip 130d is disposed on the substrate 120 by connecting the I/O pad 132d, the I/O pad 122, and the I/O pin 112. In some embodiments, the fourth IC chip 130d further includes at least one ESD protection element adjacent to the I/O pad 132d of the fourth IC chip 130d.

It is noticed that QDP device 400A in FIG. 4A illustrates four I/O pads (of the IC chips) coupling to one I/O pin (of the BGA). In other words, the I/O pin 112 of the BGA 110 simultaneously couple to the I/O pad 132a of the first IC chip 130a, the I/O pad 132b of the second IC chip 130b, the I/O pad 132c of the third IC chip 130c, and the I/O pad 132d of the fourth IC chip 130d through the I/O pad 122 of the substrate 120. Therefore, the QDP device 400A can be referred to as a 4-rank device or a plural-rank device.

With reference to FIG. 4B, FIG. 4B is a cross-sectional view of a 2-rank quad die package (QDP) device 400B in accordance with some embodiments. The difference between the QDP device 400A in FIG. 4A and the QDP device 400B in FIG. 4B is the connections of the IC chips between the I/O pins 112, 114 of the BGA 110. It is noticed that the QDP device 400B in FIG. 4B illustrates two I/O pad (of the IC chips) coupling to one I/O pin (of the BGA). In other words, the I/O pin 112 of the BGA 110 simultaneously couple to the I/O pad 132a of the first IC chip 130a and the I/O pad 132b of the second IC chip 130b through the first pad 122 of the substrate 120. Similarly, the second I/O pin 114 of the BGA 110 simultaneously couple to the I/O pad 132c of the third IC chip 130c and the I/O pad 132d of the fourth IC chip 130d through the second pad 124 of the substrate 120. Therefore, the QDP device 400B can be referred to as a 2-rank device or a plural-rank device. In some embodiments, the first IC chip 130a, the second IC chip 130b, the third IC chip 130c, and the fourth IC chip 130d are the same.

Figure 5:
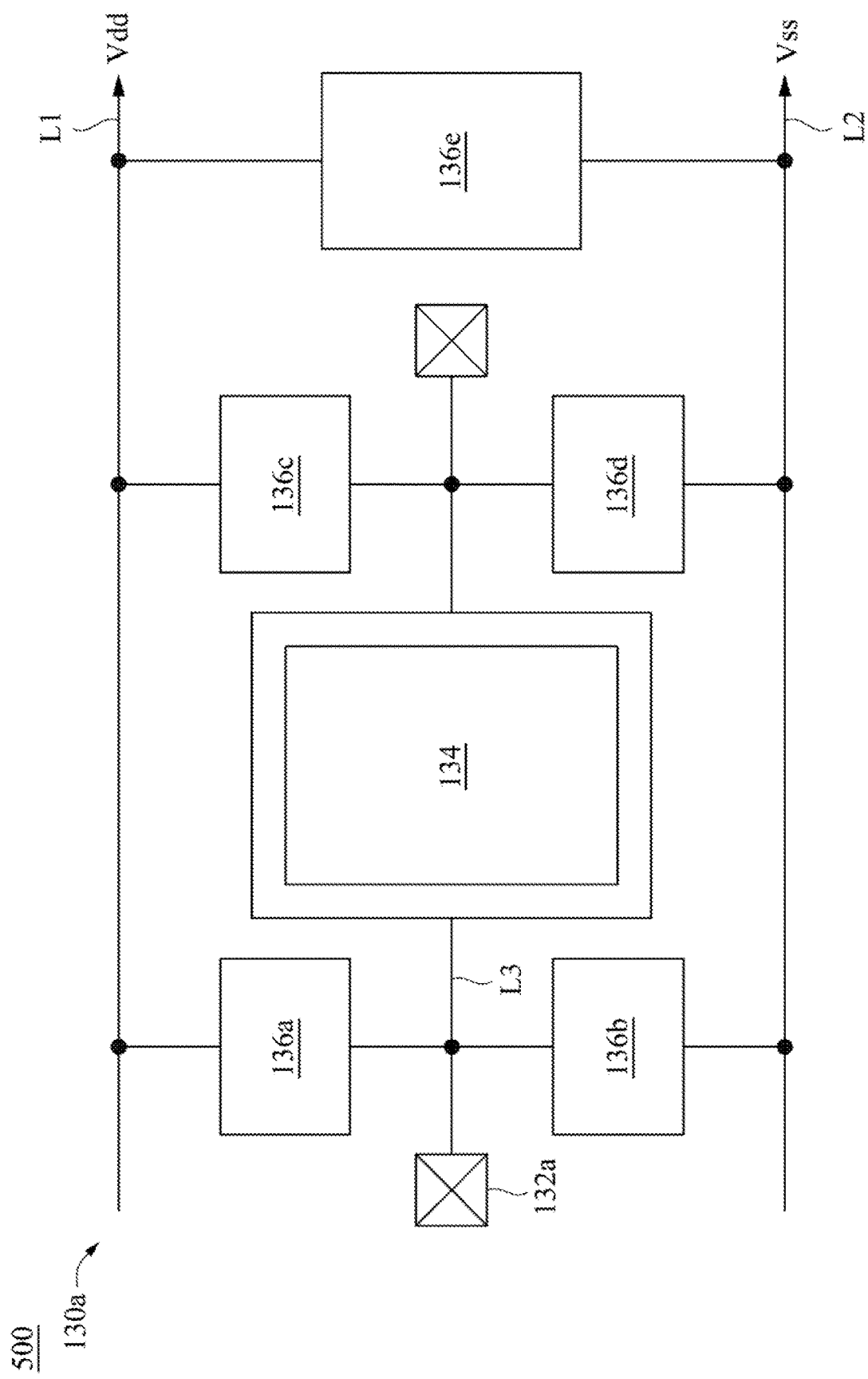
FIG. 5 is a circuit diagram schematically illustrating an example of electrostatic discharge (ESD) protection circuits of the first integrated circuit (IC) chip in accordance with some embodiments.

With reference to FIG. 5, FIG. 5 is a circuit diagram 500 schematically illustrating of an example of electrostatic discharge (ESD) protection circuits of the first integrated circuit (IC) chip 130a in accordance with some embodiments. It should be understood that the circuit diagram 500 merely an example of the ESD protection circuits, and other kinds of ESD protection circuit are also includes in the present disclosure. As shown in FIG. 5, the first IC chip 130a includes the I/O pad 132a, the internal circuits 134, ESD protection elements 136a-136e, a first voltage supply line L1, a second voltage supply line L2, a line L3. The I/O pad 132a of the first IC chip 130a is configured to exchange signals with an external device. The I/O pad 132a of the first IC chip 130a may transmit signals to the internal circuits 134. The first voltage supply line L1 is configured to supply with a positive voltage Vdd. The second voltage supply line L2 is configured to supply with a ground voltage Vss.

Still refer FIG. 5. The ESD protection elements 136a-136e are disposed near the I/O pad 132a. The ESD protection circuits of the ESD protection elements 136a-136e provide current paths of ESD to avoid electrostatic current flowing into the internal circuits 134 of the first IC chip 130a and causing damage. The detailed description and structure of the ESD protection elements 136a-136e will be discussed in FIG. 6 to FIG. 8 below. In addition, it should be understood that the circuit diagrams of the IC chips 130b-130d can be the same as the circuit diagram 500 of the first IC chips 130a shown in FIG. 5.

Figure 6:
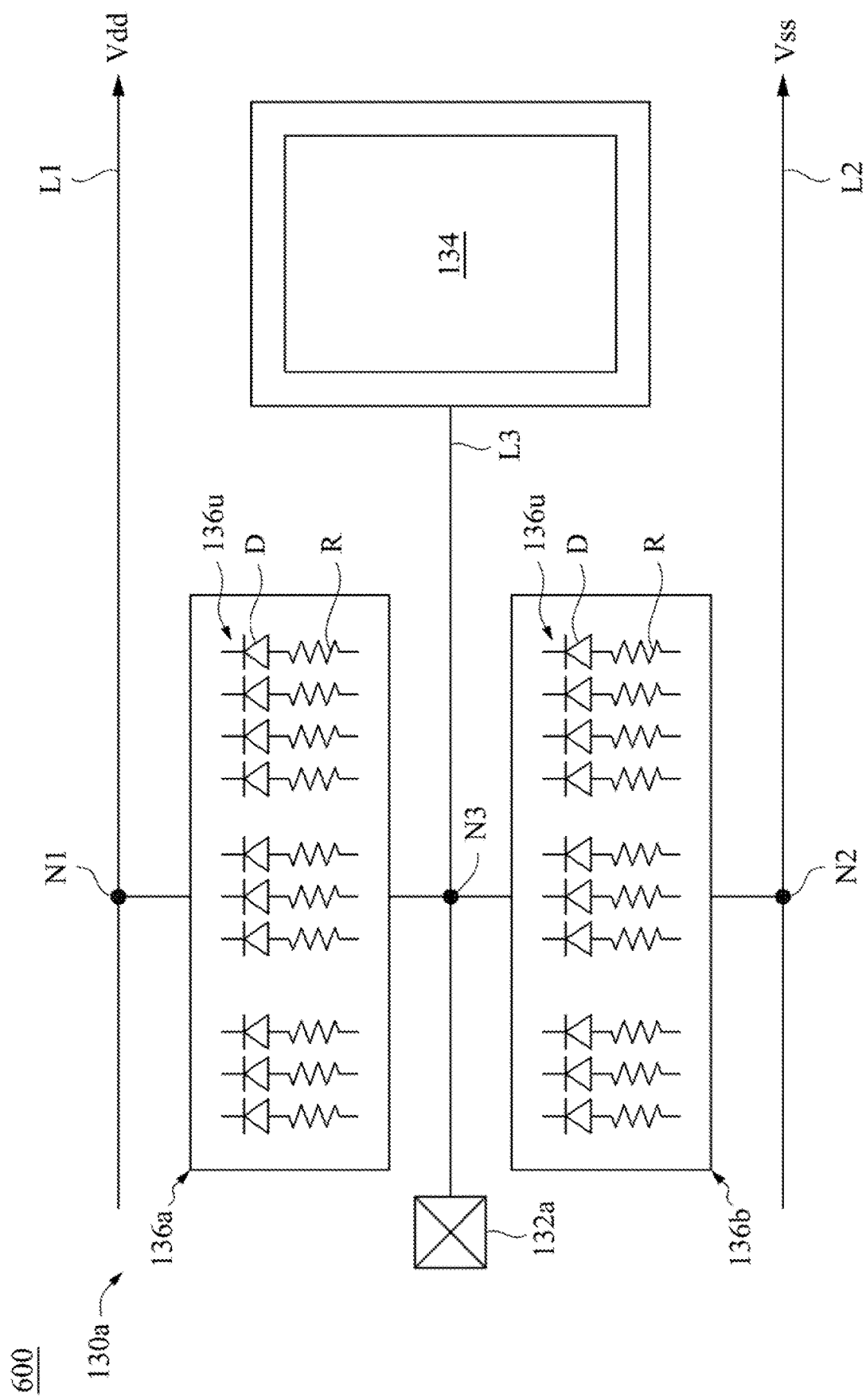
FIG. 6 is a circuit diagram schematically illustrating an example of a stage of manufacturing the electrostatic discharge (ESD) protection circuits in FIG. 5.

With reference to FIG. 6, FIG. 6 is a circuit diagram 600 schematically illustrating an example of a stage of manufacturing the electrostatic discharge (ESD) protection circuits in FIG. 5. Specifically, the circuit diagram 600 of the first IC chip 130a includes the I/O pad 132a, the first ESD protection element 136a, the second ESD protection element 136b, and the internal circuits 134. In the circuit diagram 600 of the first IC chip 130a, the I/O pad 132a may transmit signals to the internal circuits 134 through a node N3 of the line L3. The first voltage supply line L1 includes a node N1, and the second voltage supply line L2 includes a node N2. Each of the first ESD protection element 136a and the second ESD protection element 136b in the circuit diagram 600 includes multiple electrostatic discharge units 136u. Although each of the first ESD protection element 136a and the second ESD protection element 136b in FIG. 6 illustrates 10 electrostatic discharge units 136u, the number or size of the electrostatic discharge units 136u is not limited to the present disclosure. The electrostatic discharge unit 136u includes more than one small ESD protection circuits in series. For example, the small ESD protection circuits include a diode D and a resistor R, but not limited thereto. The structure of the second ESD protection element 136b is the same as the structure of the first ESD protection element 136a. It should be understood that the circuit diagram 600 in FIG. 6 merely illustrates an example of the electrostatic discharge units 136u, and other forms of electrostatic discharge units 136u are also includes in the present disclosure.

Figure 7:
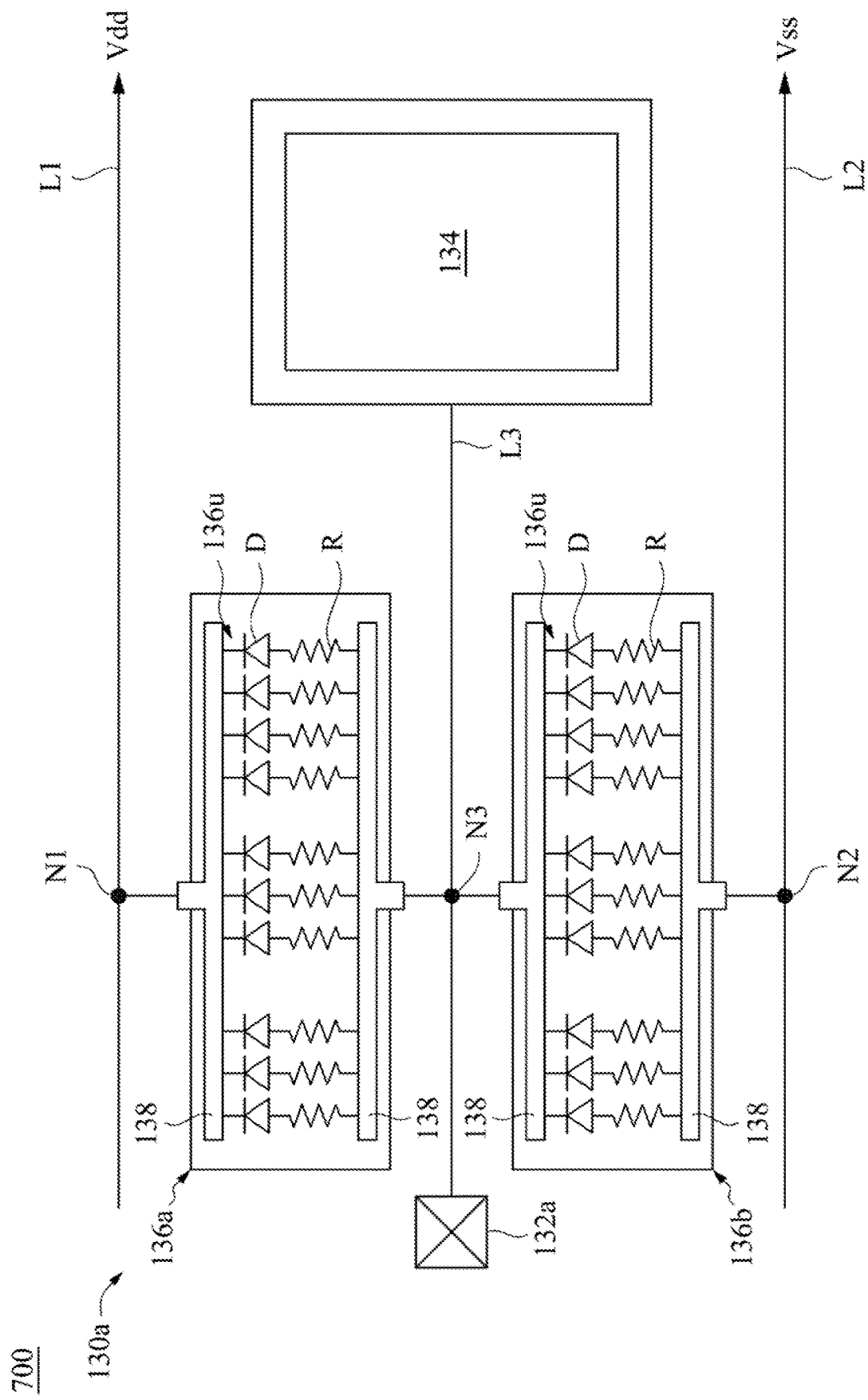
FIG. 7 is a circuit diagram for a single-rank device schematically illustrating an example of a stage of manufacturing the electrostatic discharge (ESD) protection circuit in FIG. 6.
Figure 8:
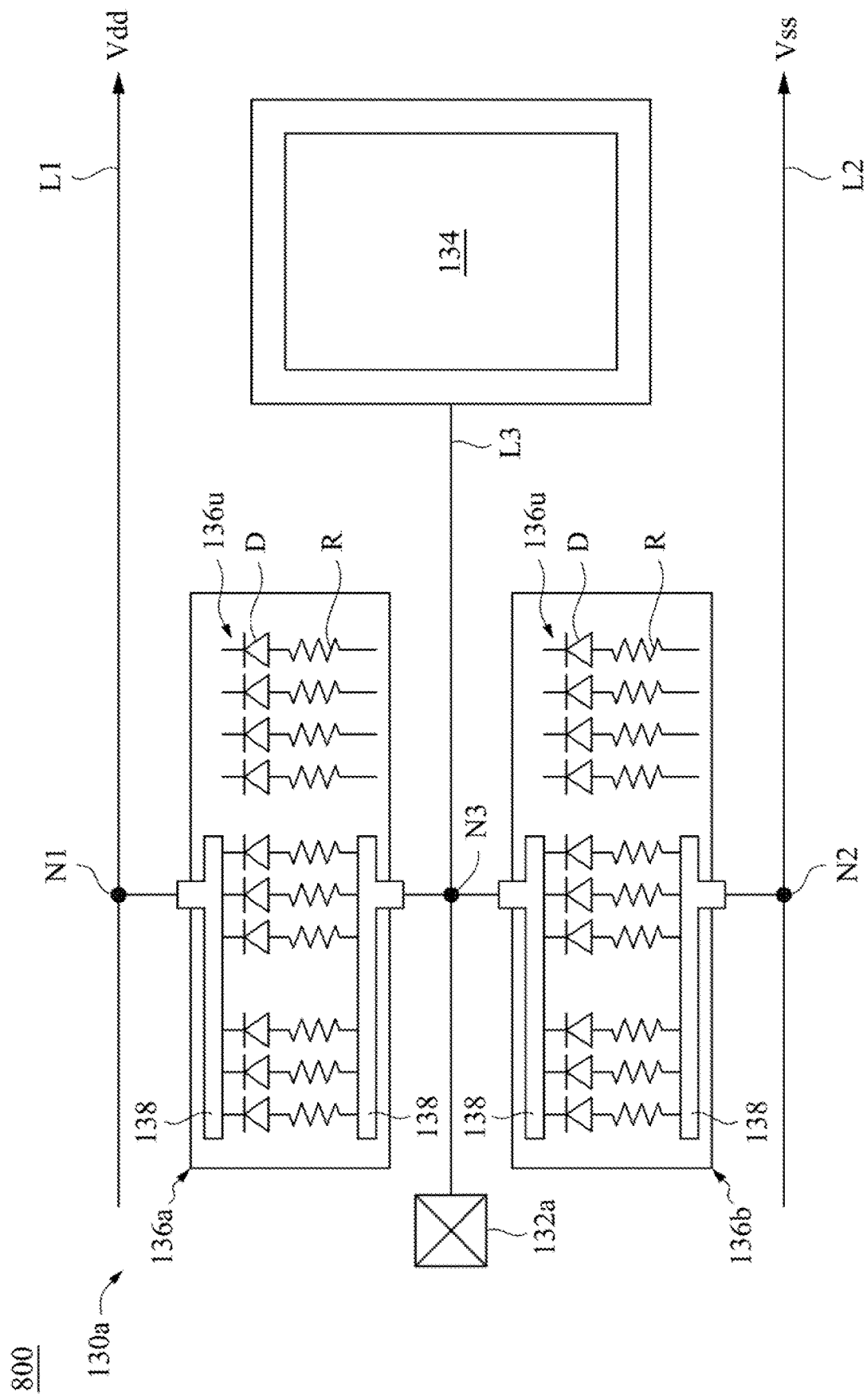
FIG. 8 is a circuit diagram for a plural-rank device schematically illustrating an example of a stage of manufacturing the electrostatic discharge (ESD) protection circuit in FIG. 6.

As shown in FIG. 6, it is noticed that cathode terminals of the diodes D of the electrostatic discharge units 136u of the first ESD protection element 136a are not coupled to the node N1 of the first voltage supply line L1, and terminals of the resistors R of the electrostatic discharge units 136u of the first ESD protection element 136a are not coupled to the node N3 of the line L3. Similarly, cathode terminals of the diodes D of the electrostatic discharge units 136u of the second ESD protection element 136b are not coupled to the node N3 of the line L3, and terminals of the resistors R of the electrostatic discharge units 136u of the second ESD protection element 136b are not coupled to the node N2 of the second voltage supply line L2. Therefore, the first ESD protection element 136a is not coupled between the line L3 and the first voltage supply line L1. The second ESD protection element 136b is not coupled between the line L3 and the second voltage supply line L2. FIG. 7 and FIG. 8 below will show the connections of the first ESD protection element 136a and the second ESD protection element 136b between the node N1, the node N2, and the node N3.

FIG. 7 is a circuit diagram 700 for a single-rank device (such as the SDP device 100 or the DDP device 200A) schematically illustrating an example of a stage of manufacturing the electrostatic discharge (ESD) protection circuit in FIG. 6. Specifically, connection circuits 138 are formed in the first ESD protection element 136a by a patterned mask, so that the first ESD protection element 136a has the function to discharge the static electricity to the first voltage supply line L1. The first ESD protection element 136a is configured to form a first electrostatic discharge path from the first I/O pad 132a to the first voltage supply line L1. The structure of the second ESD protection element 136b is the same as the structure of the first ESD protection element 136a. In other words, the patterned mask used for forming the connection circuits 138 of the first ESD protection element 136a is the same as a patterned mask used for forming the connection circuits 138 of the second ESD protection element 136b. In this case, the commonality of the patterned mask is increased. In some embodiments, it should be understood the patterned mask of the first ESD protection element 136a and the patterned mask of the second ESD protection element 136b may be different depending on the design requirements of IC chips. The second ESD protection element 136b is configured to form a second electrostatic discharge path from the first I/O pad 132a to the second voltage supply line L2. The I/O pad 132a may transmit signals to the internal circuits 134 through the node N3 of the line L3. In some embodiments, the electrostatic current would sequentially pass through the node N3 of the line L3, the first ESD protection element 136a, the node N1 of the first voltage supply line L1. In some embodiments, the electrostatic current would sequentially pass through the node N3 of the line L3, the second ESD protection element 136b, the node N2 of the second voltage supply line L2.

In the circuit diagram 700 for the single-rank device, all of the electrostatic discharge units 136u (10 electrostatic discharge units 136u in the first ESD protection element 136a and 10 electrostatic discharge units 136u in the second ESD protection element 136b) are coupled between the I/O pad 132a, the first voltage supply line L1, the second voltage supply line L2, and the first internal circuits 134.

With reference to FIG. 8, FIG. 8 is a circuit diagram 800 for a plural-rank device (such as the DDP device 200B, the TDP device 300, the QDP device 400A, or QDP device 400B) schematically illustrating an example of a stage of manufacturing the electrostatic discharge (ESD) protection circuit in FIG. 6. Specifically, connection circuits 138 are formed in the first ESD protection element 136a and the second ESD protection element 136b by a patterned mask, so that the first ESD protection element 136a and the second ESD protection element 136b have the function to discharge the static electricity to the first voltage supply line L1 and the second voltage supply line L2.

The difference between the circuit diagram 800 in FIG. 8 and the circuit diagram 700 in FIG. 7 is the connecting number of the connection circuits 138 of the electrostatic discharge units 136u. Specifically, the circuit diagram 800 in FIG. 8 illustrating 6 electrostatic discharge units 136u of the first ESD protection element 136a and 6 electrostatic discharge units 136u of the second ESD protection element 136b are coupled between the I/O pad 132a, the first voltage supply line L1, the second voltage supply line L2, and the first internal circuits 134. In other words, 4 electrostatic discharge units 136u of the first ESD protection element 136a and 4 electrostatic discharge units 136u of the second ESD protection element 136b is free of coupling to the circuit diagram 800. That is, the electrostatic discharge units 136u of the first ESD protection element 136a are selectively connected to the first ESD protection element 136a, so that at least one of the electrostatic discharge units 136u is free of coupling between the I/O pad 132a, the first voltage supply line L1, and the first internal circuit 134. Similarly, the electrostatic discharge units 136u of the second ESD protection element 136b are selectively connected to the second ESD protection element 136b, so that at least one of the electrostatic discharge units 136u is free of coupling between the I/O pad 132a, the second voltage supply line L2, and the first internal circuit 134. It should be understood that the numbers or sizes of the coupling and the non-coupling electrostatic discharge units 136u depend on the design requirements, and it is not limited to the present disclosure. If the number or size of the non-connected electrostatic discharge units 136u is too large, it may not achieve the purpose of avoiding signal attenuation. If the number or size of the non-connected electrostatic discharge units 136u is too little, it may not have enough protection capability for the internal circuits of the IC chip.

Please refer to FIG. 2B and FIG. 8. In some embodiments, the circuit diagram 800 is disposed on the first IC chip 130a. In the circuit diagram 800, because the I/O pin 112 of the BGA 110 couples to more than two I/O pads of the IC chips (that is, the I/O pad 132a of the first IC chip 130a and the I/O pad 132b of the second IC chip 130b), the first ESD protection element 136a and/or the second ESD protection element 136b in FIG. 8 can provide enough protection capability for the internal circuits 134 of the first IC chip 130a. In other words, the first ESD protection element 136a and/or the second ESD protection element 136b in FIG. 8 can reduce the capacitance of the I/O pad 132a of the first IC chip 130a, thereby achieving better signal quality.

It should be understood that the circuit diagram 800 in FIG. 8 merely illustrates the first ESD protection element 136a and/or the second ESD protection element 136b of the first IC chip 130a. However, the circuit diagram 800 also can be applied in the second IC chip 130b, the third IC chip 130c, and the fourth IC chip 130d. Specifically, each of the second IC chip 130b, the third IC chip 130c, and the fourth IC chip 130d may include the first ESD protection element 136a and/or the second ESD protection element 136b in FIG. 8. The first ESD protection element 136a and/or the second ESD protection element 136b in FIG. 8 may be adjacent to the I/O pad 132b of the second IC chip 130b, the I/O pad 132c of the third IC chip 130c, and/or the I/O pad 132d of the fourth IC chip 130d, respectively.

Figure 9C:
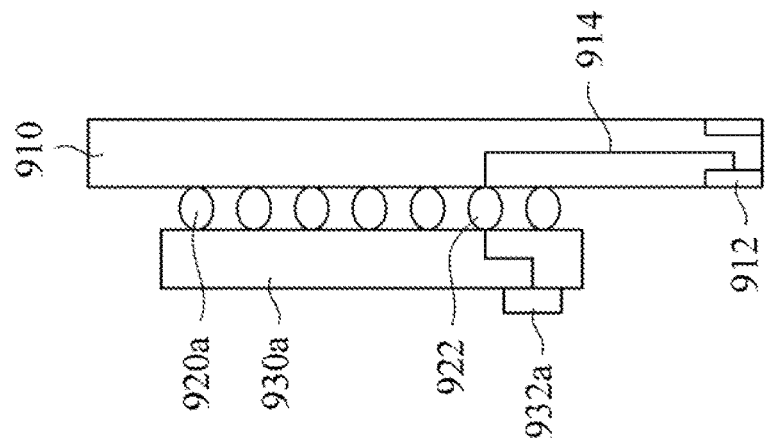
FIG. 9C is a cross-sectional view of the 1-rank double in-line memory module (DIMM) device in FIG. 9A and FIG. 9B.
Figure 9A:
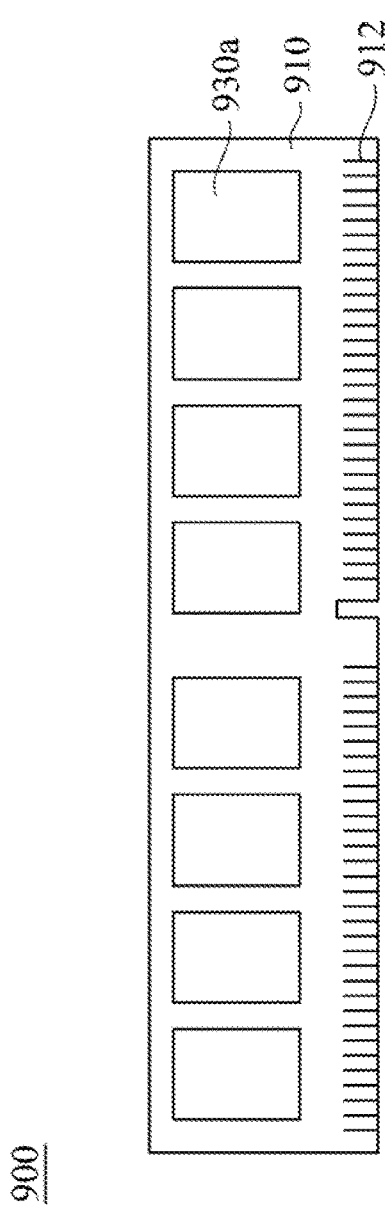
FIG. 9A and FIG. 9B are top views of a 1-rank double in-line memory module (DIMM) device in accordance with some embodiments.
Figure 9B:
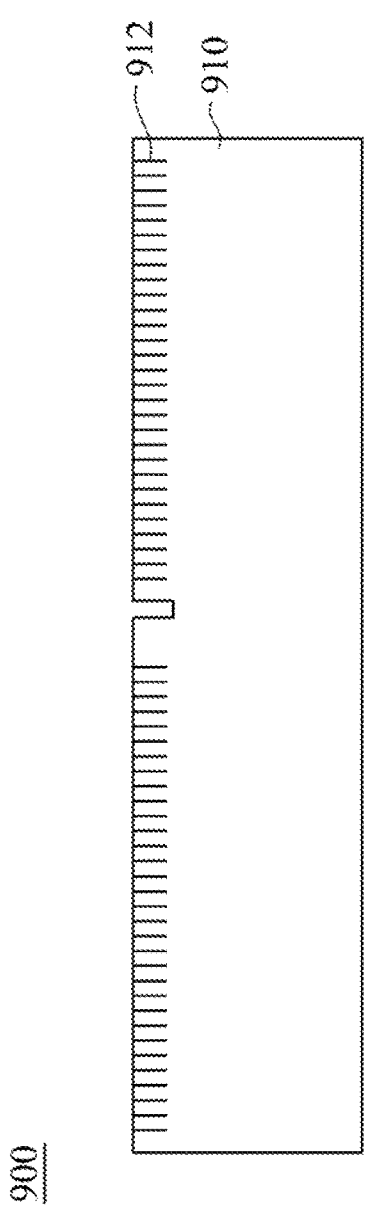

Please refer to FIG. 9A, FIG. 9B, and FIG. 9C. FIG. 9A and FIG. 9B are top views of a 1-rank double in-line memory module (DIMM) device 900 in accordance with some embodiments. FIG. 9C is a cross-sectional view of the 1-rank double in-line memory module (DIMM) device 900 in FIG. 9A and FIG. 9B.

The DIMM device 900 includes a substrate 910, a first ball grid array (BGA) 920a, and a fifth integrated circuit (IC) chip 930a. The first BGA 920a is disposed on the substrate 910. A fifth IC chip 930a is disposed on the first BGA 920a, and the fifth IC chip 930a includes a fifth internal circuit. An input/output (I/O) pad 912 of the substrate 910 is disposed on the substrate 910 and is coupled to a first input/output (I/O) pin 922 of the first BGA 920a through a wire 914. In some embodiments, the substrate 910 can be a printed circuit board. In some embodiments, the I/O pad 912 of the substrate 910 can be referred to as golden finger, which is used for transmitting signals and connecting the power.

Please refer to FIG. 10A, FIG. 10B, and FIG. 10C. FIG. 10A and FIG. 10B are top views of a 2-rank double in-line memory module (DIMM) device 1000 in accordance with some embodiments. FIG. 10C is a cross-sectional view of the 2-rank double in-line memory module (DIMM) device 1000 in FIG. 10A and FIG. 10B.

The difference between the DIMM device 900 in FIG. 9A to FIG. 9C and the DIMM device 1000 in FIG. 10A to FIG. 10C is that the DIMM device 1000 further includes a second ball grid array (BGA) 920b and a sixth integrated circuit (IC) chip 930b. The fifth IC chip 930a and the sixth IC chip 930b are separately disposed on different sides of the substrate 910. The second BGA 920*b* is disposed on the substrate 910. The sixth IC chip 930*b* is disposed on the second BGA 920*b* and includes a sixth internal circuit. The I/O pad 912 of the substrate 910 is coupled to a second input/output (I/O) pin 924 of the second BGA 920*b* through a wire 915. Specifically, in the DIMM device 1000 of FIG. 10C, the I/O pad 912 of the substrate 910 simultaneously couples to the first I/O pin 922 of the first BGA 920*a* and the second I/O pin 924 of the second BGA 920*b*. Therefore, the DIMM device 1000 can be referred to as a 2-rank device or a plural-rank device.

Please refer to the circuit diagram 800 in FIG. 8 again. The circuit diagram 800 of the first IC chip 130*a* also can be applied to the fifth IC chip 930*a* (see FIG. 10C), the sixth IC chip 930*b* (see FIG. 10C), a seventh IC chip 930*c* (see FIG. 11C), and an eight IC chip 930*d* (see FIG. 11C). In the DIMM device 1000 of FIG. 10C, the first ESD protection element 136*a* and/or the second ESD protection element 136*b* in FIG. 8 is/are disposed adjacent to the I/O pad 932*a* of the fifth IC chip 930*a* to reduce the capacitance of the I/O pad 932*a* of the fifth IC chip 930*a*, thereby achieving better signal quality. In some embodiments, the fifth IC chip 930*a* in FIG. 10A to FIG. 10C includes a first ESD protection element 136*a* coupled between the I/O pad 932*a* and the fifth internal circuit of the fifth IC chip 930*a*. The first ESD protection element 136*a* is configured to form a first electrostatic discharge path from the I/O pad 932*a* of the fifth IC chip 930*a* to a first voltage supply line L1. The first ESD protection element 136*a* includes multiple ESD units 136*u*, and at least one of the ESD units 136*u* is free of coupling between the I/O pad 932*a* of the fifth IC chip 930*a*, the first voltage supply line L1, and the fifth internal circuit. The fifth IC chip 930*a* in FIG. 10A to FIG. 10C further includes a second ESD protection element 136*b* coupled between the I/O pad 932*a* and the fifth internal circuit of the fifth IC chip 930*a*. The second ESD protection element 136*b* is configured to form a second electrostatic discharge path from the I/O pad 932*a* to a second voltage supply line L2. The second ESD protection 136*b* element includes multiple ESD units 136*u*, and at least one of the ESD units 136*u* is free of coupling between the I/O pad 932*a*, the second voltage supply line L2, and the fifth internal circuit. In some embodiments, the sixth IC chip 930*b* in FIG. 10A to FIG. 10C includes a first ESD protection element 136*a* coupled between the I/O pad 932*b* and the sixth internal circuit of the sixth IC chip 930*b*. The circuit diagram and features of the sixth IC chip 930*b* would be the same as the circuit diagram and features of the fifth IC chip 930*a*, and it will not repeatedly describe herein.

Figure 11C:
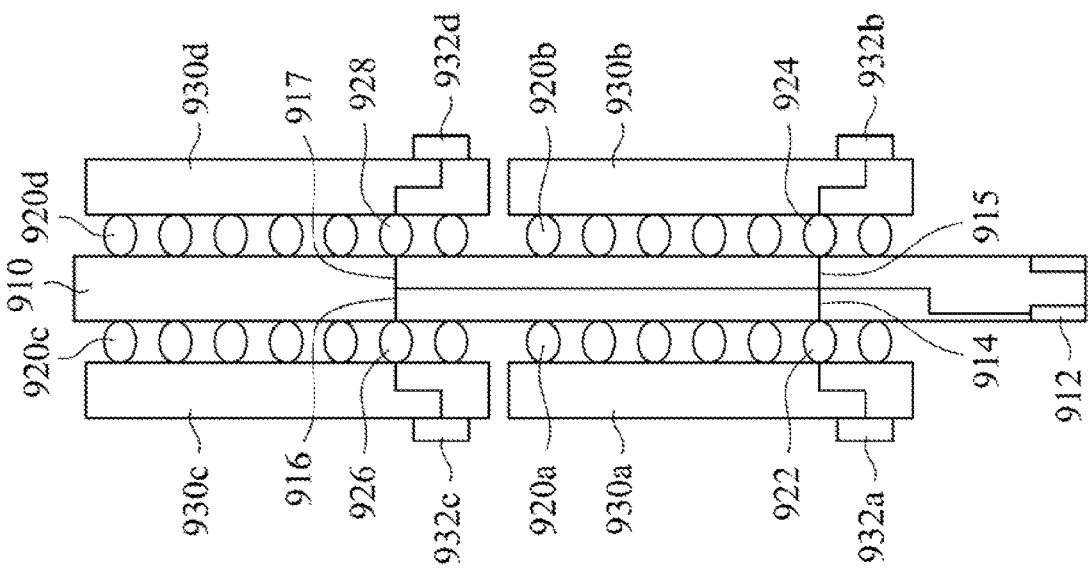
FIG. 11C is a cross-sectional view of the 4-rank double in-line memory module (DIMM) device in FIG. 11A and FIG. 11B.
Figure 11A:
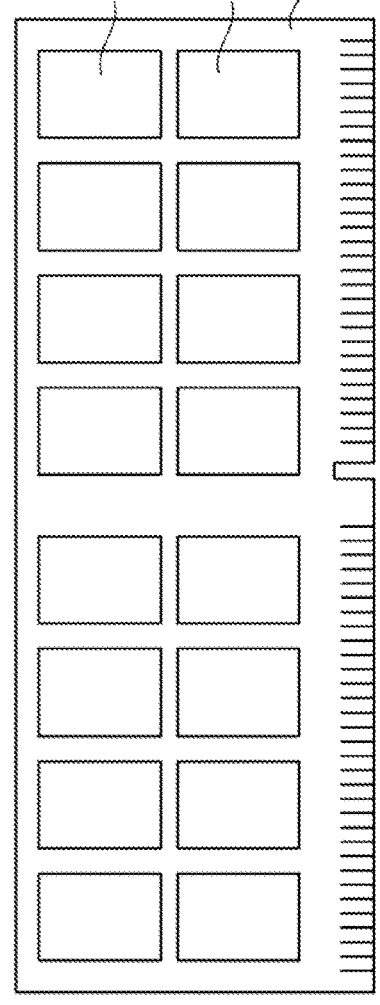
FIG. 11A and FIG. 11B are top views of a 4-rank double in-line memory module (DIMM) device in accordance with some embodiments.
Figure 11B:
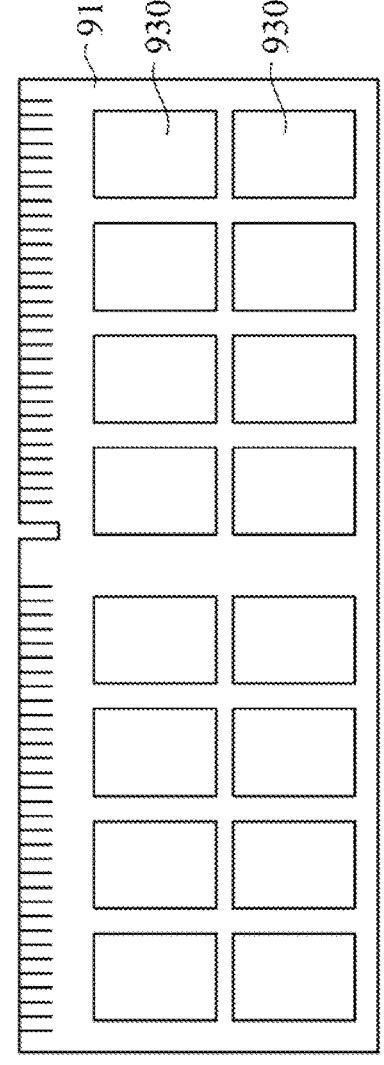

Please refer to FIG. 11A, FIG. 11B, and FIG. 11C. FIG. 11A and FIG. 11B are top views of a 4-rank double in-line memory module (DIMM) device 1100 in accordance with some embodiments. FIG. 11C is a cross-sectional view of the 4-rank double in-line memory module (DIMM) device 1100 in FIG. 11A and FIG. 11B.

The difference between the DIMM device 1000 in FIG. 10A to FIG. 10C and the DIMM device 1100 in FIG. 11A to FIG. 11C is that the DIMM device 1100 further includes a third ball grid array (BGA) 920*c*, a seventh integrated circuit (IC) chip 930*c*, a fourth ball grid array (BGA) 920*d*, an eighth integrated circuit (IC) chip 930*d*. The fifth IC chip 930*a* and the seventh IC chip 930*c* are disposed on one side of the substrate 910, and the sixth IC chip 930*b* and the eighth IC chip 930*d* are disposed on another side of the substrate 910. The third BGA 920*c* is disposed on the substrate 910. The seventh IC chip 930*c* is disposed on the third BGA 920*c* and includes a seventh internal circuit. The I/O pad 912 of the substrate 910 is coupled to a third input/output (I/O) pin 926 of the third BGA 920*c* through a wire 916. The eighth IC chip 930*d* is disposed on the fourth BGA 920*d* and includes an eighth internal circuit. The I/O pad 912 of the substrate 910 is coupled to a fourth input/output (I/O) pin 928 of the fourth BGA 920*d* through a wire 917. Specifically, in the DIMM device 1100 of FIG. 11C, the I/O pad 912 of the substrate 910 simultaneously couples to the first I/O pin 922 of the first BGA 920*a*, the second I/O pin 924 of the second BGA 920*b*, the third I/O pin 926 of the third BGA 920*c*, and the fourth I/O pin 928 of the fourth BGA 920*d*. Therefore, the DIMM device 1100 can be referred to as a 4-rank device or a plural-rank device.

Figure 12:
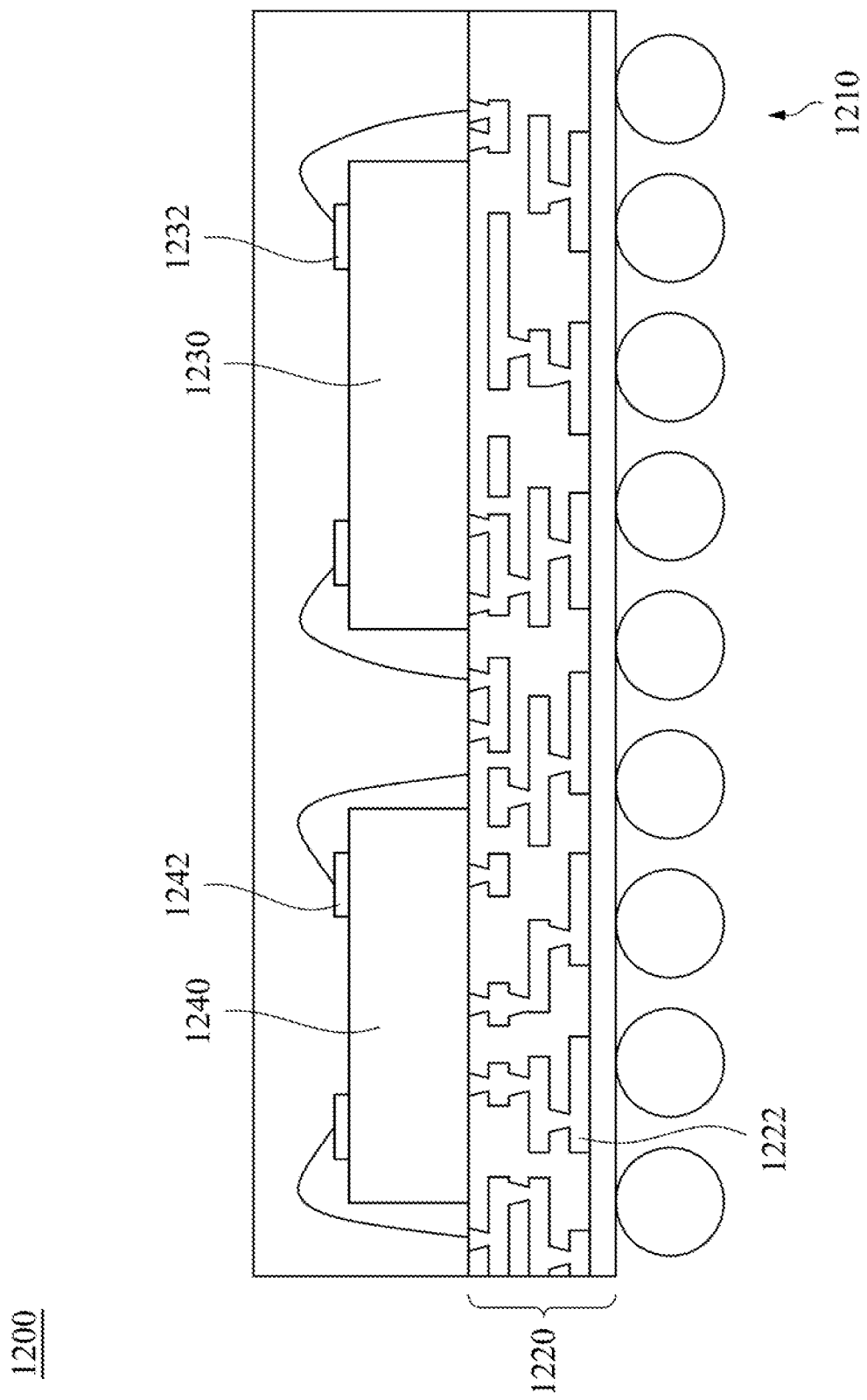
FIG. 12 is a cross-sectional view of a silicon in package (SiP) device in accordance with some embodiments.

Please refer to FIG. 12. FIG. 12 is a cross-sectional view of a silicon in package (SiP) device 1200 in accordance with some embodiments. The SiP device 1200 includes a ball grid array (BGA) 1210, a substrate 1220, a memory device 1230, and a processor 1240. The substrate 1220 is disposed on the BGA 1210, and the substrate 1220 includes an interconnect structure 1222. The memory device 1230 is disposed on the substrate 1220. The memory device 1230 includes an internal circuit and an input/output (I/O) pad 1232 disposed on the memory device 1230. The processor 1240 is disposed on the substrate 1220 and is adjacent to the memory device 1230, as shown in FIG. 12. The I/O pad 1232 of the memory device 1230 couples to an I/O pad 1242 of the processor 1240 through the interconnect structure 1222 of the substrate 1220. Specifically, the I/O pad 1232 of the memory device 1230 is not coupled to the BGA 1210.

Please refer to the circuit diagram 800 in FIG. 8 again. The circuit diagram 800 of the first IC chip 130*a* also can be applied to the memory device 1230 (see FIG. 12) and a flash memory 1330 (see FIG. 13). In other words, the first ESD protection element 136*a* and/or the second ESD protection element 136*b* in FIG. 8 is/are disposed adjacent to the I/O pad 1232 of the memory device 1230 to reduce the capacitance of the I/O pad 1232 of the memory device 1230, thereby achieving better signal quality. In some embodiments, the memory device 1230 in FIG. 12 includes a first ESD protection element 136*a* coupled between the I/O pad 1232 and the internal circuit of the memory device 1230. The first ESD protection element 136*a* is configured to form a first electrostatic discharge path from the I/O pad 1232 of the memory device 1230 to a first voltage supply line L1. The first ESD protection element 136*a* includes multiple ESD units 136*u*, and at least one of the ESD units 136*u* is free of coupling between the I/O pad 1232 of the memory device 1230, the first voltage supply line L1, and the internal circuit of the memory device 1230. The memory device 1230 in FIG. 12 further includes the second ESD protection element 136*b* coupled between the I/O pad 1232 and the internal circuit of the memory device 1230. The second ESD protection element 136*b* is configured to form a second electrostatic discharge path from the I/O pad 1232 of the memory device 1230 to a second voltage supply line L2. The second ESD protection 136*b* element includes multiple ESD units 136*u*, and at least one of the ESD units 136*u* is free of coupling between the I/O pad 1232 of the memory device 1230, the second voltage supply line L2, and the internal circuit of the memory device 1230.

Figure 13:
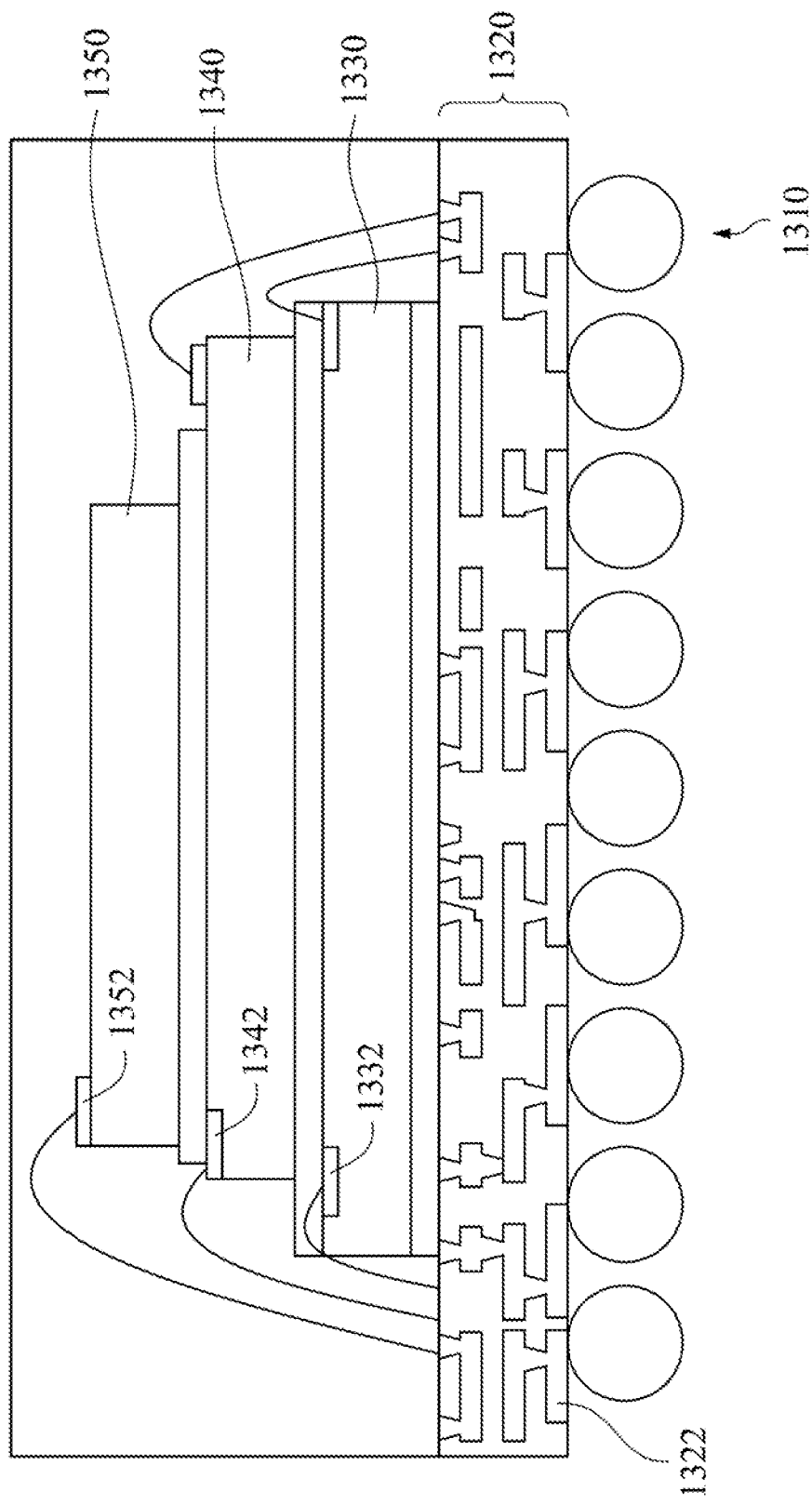
FIG. 13 is a cross-sectional view of an embedded multi-chip package (eMCP) device in accordance with some embodiments.

Please refer to FIG. 13. FIG. 13 is a cross-sectional view of an embedded multi-chip package (eMCP) device 1300 in accordance with some embodiments. The eMCP device 1300 includes a ball grid array (BGA) 1310, a substrate 1320, a flash memory 1330, a dynamic random access memory (DRAM) 1340, and a flash controller 1350. The substrate 1320 is disposed on the BGA 1310, and the substrate 1320 includes an interconnect structure 1322. The flash memory 1330 is disposed on the substrate 1320, the DRAM 1340 is stacked on the flash memory 1330, and the flash controller 1350 is stacked on the DRAM 1340, as shown in FIG. 13. An input/output (I/O) pad 1332 of the flash memory 1330 is disposed on the flash memory 1330. An input/output (I/O) pad 1342 of the DRAM 1340 is disposed on the DRAM 1340. An input/output (I/O) pad 1352 of the flash controller 1350 is disposed on the flash controller 1350. The I/O pad 1332 of the flash memory 1330 couples to the I/O pad 1352 of the flash controller 1350 through the interconnect structure 1322 of the substrate 1320. Specifically, the I/O pad 1332 of the flash memory 1330 is not coupled to the BGA 1310. In addition, the first ESD protection element 136a and/or the second ESD protection element 136b in FIG. 8 is/are disposed adjacent to the I/O pad 1332 of the flash memory 1330 to reduce the capacitance of the I/O pad 1332 of the flash memory 1330, thereby achieving better signal quality.

In some alternative embodiments, the first ESD protection element 136a and/or the second ESD protection element 136b in FIG. 8 can be applied to a solid state disk (SSD) device. Specifically, the SSD device includes the plural-rank device, such as the DDP device 200B, the TDP device 300, the QDP device 400A, the QDP device 400B, the DIMM device 1000, or the DIMM device 1100. The first ESD protection element 136a and/or the second ESD protection element 136b in FIG. 8 is/are disposed in the SSD device to get better signal quality. In addition, the plural-rank device (such as the DDP device 200B, the TDP device 300, the QDP device 400A, the QDP device 400B, the DIMM device 1000, or the DIMM device 1100) can be applied in the flash memory 1330 and/or the DRAM 1340 of the eMCP device 1300.

The present disclosure provides an ESD protection element of an IC chip to reduce input capacitance of the IC chip. The disclosed ESD protection element includes multiple ESD units, and at least one of the ESD units is free of coupling to the circuits in the IC chip. The ESD protection element of the present disclosure can be applied in a plural-rank device (such as a 2-rank device, a 3-rank device, or a 4-rank device), a silicon in package (SiP) device, an embedded multi-chip package (eMCP) device, or a solid state disk (SSD) device. The disclosed ESD protection element can reduce the capacitance of the I/O pad of the IC chip, thereby achieving better signal quality. Better signal quality has benefits for high-performance computing and decreasing operating voltage of the signals. In addition, if the circuits of different ESD protection elements are the same, it would increase the commonality of the patterned mask and decrease the manufacturing cost of ESD protection elements.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A memory device, comprising:
   a substrate, comprising a first input/output pad disposed on the substrate;
   a first ball grid array disposed on the substrate, and comprising a first input/output pin;
   a first integrated circuit chip disposed on the first ball grid array and comprising:
      a first internal circuit; and
      a second input/output pad disposed on the first integrated circuit chip and coupled to the first internal circuit,
      wherein the first input/output pad and the second input/output pad couples to the first input/output pin; and
   a first electrostatic discharge protection element coupled between the second input/output pad and the first internal circuit,
      wherein the first electrostatic discharge protection element is configured to form a first electrostatic discharge path from the second input/output pad to a first voltage supply line,
      wherein the first electrostatic discharge protection element comprises multiple electrostatic discharge units, and at least one of the electrostatic discharge units is free of coupling between the second input/output pad, the first voltage supply line, and the first internal circuit.

2. The memory device of claim 1, further comprising a second electrostatic discharge protection element coupled between the second input/output pad and the first internal circuit,
   wherein the second electrostatic discharge protection element is configured to form a second electrostatic discharge path from the second input/output pad to a second voltage supply line,
   wherein the second electrostatic discharge protection element comprises multiple electrostatic discharge units, and at least one of the electrostatic discharge units is free of coupling between the second input/output pad, the second voltage supply line, and the first internal circuit.

3. The memory device of claim 1, wherein each of the electrostatic discharge units comprises more than one electrostatic discharge protection circuits in series.

4. The memory device of claim 1, further comprising:
   a second ball grid array disposed on the substrate, and comprising a second input/output pin; and
   a second integrated circuit chip disposed on the second ball grid array and comprising:
      a second internal circuit; and
      a third input/output pad disposed on the second integrated circuit chip and coupled to the second internal circuit,
      wherein the first input/output pad and the third input/output pad couples to the second input/output pin.

5. The memory device of claim 4, further comprising:
   a third ball grid array disposed on the substrate, and comprising a third input/output pin;
   a third integrated circuit chip disposed on the third ball grid array and comprising:
      a third internal circuit; and
      a fourth input/output pad disposed on the third integrated circuit chip and coupled to the third internal circuit,
      wherein the first input/output pad and the fourth input/output pad couples to the third input/output pin;
   a fourth ball grid array disposed on the substrate, and comprising a fourth input/output pin; and a fourth integrated circuit chip disposed on the fourth ball grid array and comprising:
   a fourth internal circuit; and
   a fifth input/output pad disposed on the fourth integrated circuit chip and coupled to the fourth internal circuit,
   wherein the first input/output pad and the fifth input/output pad couples to the fourth input/output pin.

6. A semiconductor device, comprising:
a ball grid array;
a substrate disposed on the ball grid array and comprising an interconnect structure;
a memory device disposed on the substrate, and comprising an internal circuit and a first input/output pad disposed on the memory device;
a processor disposed on the substrate and adjacent to the memory device; and
a first electrostatic discharge protection element coupled between the first input/output pad and the internal circuit,
   wherein the first electrostatic discharge protection element is configured to form a first electrostatic discharge path from the first input/output pad to a first voltage supply line,
   wherein the first electrostatic discharge protection element comprises multiple electrostatic discharge units, and at least one of the electrostatic discharge units is free of coupling between the first input/output pad, the first voltage supply line, and the internal circuit,
   wherein the first input/output pad of the memory device couples to a second input/output pad of the processor through the interconnect structure.

7. The semiconductor device of claim 6, further comprising a second electrostatic discharge protection element coupled between the first input/output pad and the internal circuit,
   wherein the second electrostatic discharge protection element is configured to form a second electrostatic discharge path from the first input/output pad to a second voltage supply line,
   wherein the second electrostatic discharge protection element comprises multiple electrostatic discharge units, and at least one of the electrostatic discharge units is free of coupling between the first input/output pad, the second voltage supply line, and the internal circuit.

8. The semiconductor device of claim 6, wherein the memory device is a dynamic random access memory.

9. The semiconductor device of claim 6, wherein the memory device is a flash memory.

10. The semiconductor device of claim 9, wherein the processor is a flash controller stacked on the memory device.

11. The semiconductor device of claim 9, further comprising a dynamic random access memory stacked between the memory device and the processor.

* * * * *